(12) United States Patent
Rousset et al.

(10) Patent No.: US 8,773,112 B2
(45) Date of Patent: Jul. 8, 2014

(54) CURRENT SENSOR

(75) Inventors: David Rousset, Toulouse (FR); Arnaud Davy, Pechbonnieu (FR)

(73) Assignee: Airbus Operations SAS, Toulouse (FR)

( * ) Notice: Subject to any disclaimer, the term of this patent is extended or adjusted under 35 U.S.C. 154(b) by 580 days.

(21) Appl. No.: 12/669,560

(22) PCT Filed: Jul. 10, 2008

(86) PCT No.: PCT/FR2008/051298
§ 371 (c)(1),
(2), (4) Date: May 6, 2010

(87) PCT Pub. No.: WO2009/024692
PCT Pub. Date: Feb. 26, 2009

(65) Prior Publication Data
US 2011/0101963 A1 May 5, 2011

(30) Foreign Application Priority Data
Jul. 19, 2007 (FR) ..................................... 07 56599

(51) Int. Cl.
*G01R 15/20* (2006.01)
*G01R 19/20* (2006.01)
(52) U.S. Cl.
USPC ................... 324/117 R; 324/117 H; 324/126; 324/127; 324/253
(58) Field of Classification Search
USPC ........................... 324/117 R, 117 H, 126–127
See application file for complete search history.

(56) References Cited

U.S. PATENT DOCUMENTS

| | | | |
|---|---|---|---|
| 4,529,931 A | 7/1985 | Kuhns | |
| 5,223,789 A | 6/1993 | Katsuyama et al. | |
| 6,713,999 B1 * | 3/2004 | Lenhard et al. | 324/117 R |
| 2003/0158474 A1 * | 8/2003 | Scherer et al. | 600/409 |
| 2006/0192550 A1 * | 8/2006 | Sandquist et al. | 324/117 R |

FOREIGN PATENT DOCUMENTS

| | | |
|---|---|---|
| DE | 2920484 A1 | 12/1980 |
| DE | 19642472 A1 | 4/1998 |
| JP | S61-155862 | 7/1986 |
| JP | H01-214215 | 8/1989 |
| JP | H01-308004 | 12/1989 |
| JP | 02287266 A | 11/1990 |
| JP | H03-216559 | 9/1991 |
| JP | 04064068 A | 2/1992 |
| WO | 2006093724 | 9/2006 |
| WO | 2007005578 A | 1/2007 |

OTHER PUBLICATIONS

International Search Report and Written Opinion dated Jan. 9, 2009.
Japanese Office Action, Sep. 25, 2013.

* cited by examiner

*Primary Examiner* — Arleen M Vazquez
*Assistant Examiner* — Son Le
(74) *Attorney, Agent, or Firm* — Greer, Burns & Crain Ltd.

(57) ABSTRACT

To produce an insulated current sensor for slaving power devices in the field of avionics, use is made of a magnetic core through which there passes an element traversed by a current to be measured. The magnetic core comprises a secondary winding across the terminals of which are connected an oscillator and a measurement device. The cooperation of the oscillator and of the measurement device makes it possible to circumvent all the traditional drifting of current sensors.

18 Claims, 3 Drawing Sheets

CURRENT SENSOR

CROSS-REFERENCE TO RELATED APPLICATION

This application is the National Stage of International Application No. PCT/FR2008/051298 International Filing Date, 10 Jul. 2008, which designated the United States of America, and which International Application was published under PTC Article 21 (s) as WO Publication No. WO2009/024692 A1 and which claims priority from the benefit of French Application No. 200756599 filed on 19 Jul. 2007, the disclosures of which are incorporated herein by reference in their entireties.

BACKGROUND

The aspects of the related embodiments relate to an improved insulated current sensor and adapted to slave power electronic devices for onboard avionics.

The domain of the disclosed embodiments is that of current sensors. More specifically, the domain of the disclosed embodiments is that of slaving/controlling power electronic devices that are developed mainly in the aeronautics, automotive, rail, and energy industries. In such electronic systems, the measurement of the physical quantities "current" size is effectively a control variable to be measured in order to control the device.

SUMMARY

A goal of the disclosed embodiments is to provide a sensor for the avionics environment, particularly a sensor that supports an important variation in temperatures.

Another goal of the disclosed embodiments is to provide a sensor with a wide range of use.

Another goal of the disclosed embodiments is to provide a sensor with good linearity.

In the prior art, there are several devices that are used to measure currents and that are integrated into the control loops of electronic devices.

The most obvious way to measure a current is that of a shunt resistor, which involves using in parallel a low value resistor and measuring the voltage at the terminals. Simple in appearance, this method is not entirely satisfactory.

The currents to be measured flow through high-voltage (hundreds of volts) conductors, and it is not easy to extract this measurement and restore the electrical ground.

An insulated amplifier is often required. The associated electronics is then quickly complicated (secondary power supply referenced to the potential of the conductor, transformer).

A resistor is a high heat dissipation component. To measure a current, a low-value current is generally chosen in order to minimize losses by dissipation, but this also comes as a disadvantage because very low voltage levels have to be measured (around a few millivolts) for low currents, which causes a significant loss of accuracy. It then becomes necessary to find a compromise between accuracy and losses due to the measuring resistor. With this solution, the measurement device must be adjusted to each use.

Another solution from the prior art is to measure the current by the closed loop Hall sensor method. FIG. 1 illustrates this solution.

That is, a main conductor 101 is traversed by a current to be measured Iprim. The main conductor passes through a magnetic core 102, whose role is to bring together the field lines created by passing the current Iprim through the main conductor 101.

A Hall-effect chip 103 is included in an air gap in the magnetic circuit. The Hall-effect chip creates a voltage Vh proportional to the magnetic flux density B, the current Ic, and a constant called the Hall constant. This voltage Vh is amplified by an amplifier 104 and converted into a proportional current Is.

A secondary coil 105 with Ns turns receives the current Is. This is called a compensation coil, because traversed by the current Is, it opposes the ampere-turns created in the magnetic core by the main conductor in order to have: Ns*Is−Nprim*Iprim=0

The final Vsense expression measured at the measuring resistor 106 terminals and based on the Iprim quantity is:

$$Vint = Rsense(Nprim/Ns)Iprim$$

These Hall-effect sensors have limitations, however, making their use complex in some environments. Some of these limitations include the following:

A risk of magnetic offset in the event of an overcurrent. This overload can lead to accidental saturation due to the residual field from the magnetic material. This adversely affects the accuracy of the sensor. It must then be demagnetized. Frequent maintenance for this is therefore necessary.

Generally, the sensor is highly sensitive to temperature variations. The computing constant relating the field B to the voltage Vh in the Hall-effect cell varies according to the temperature. The cell also causes offset voltages, causing inaccuracies in the vicinity of the zero current.

The disclosed embodiments will be better understood upon reading the following description and studying the figures that accompany it. They are presented for illustrative purposes and are not limiting to the disclosed embodiments. The figures show:

DETAILED DESCRIPTION

Figure 1:
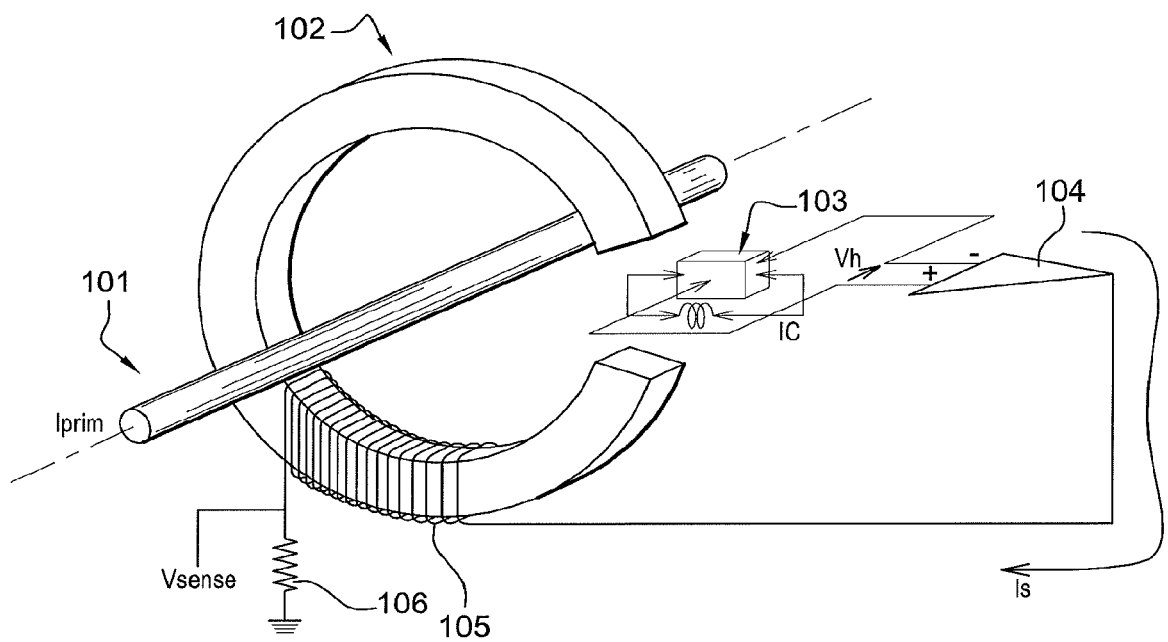
FIG. 1: An illustration of a sensor from the prior art.
Figure 2:
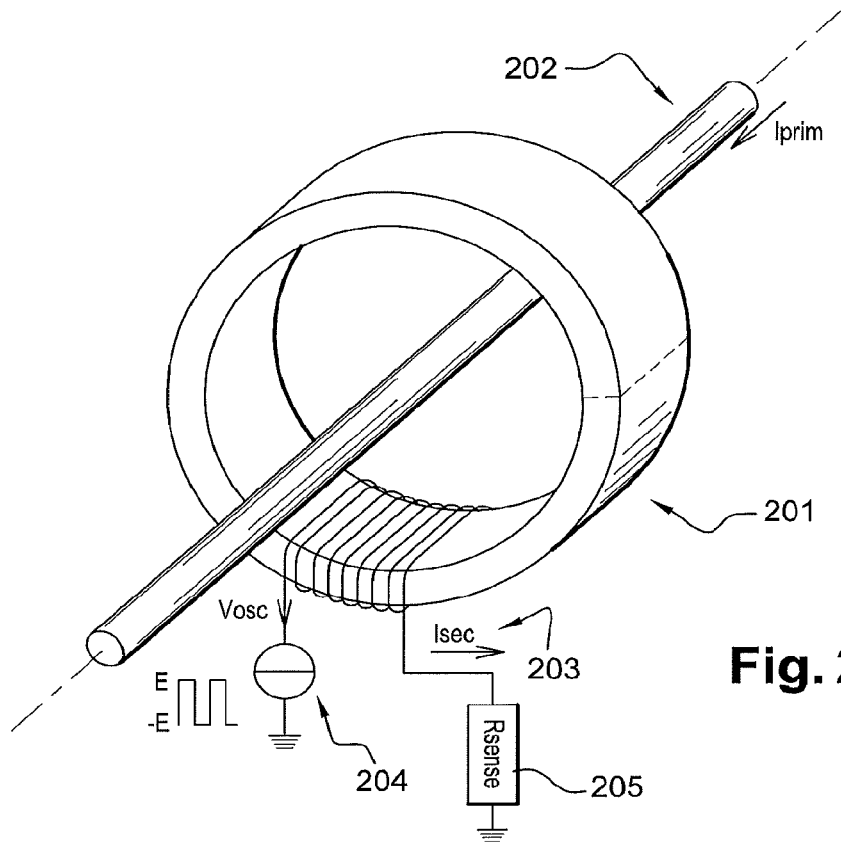
FIG. 2: An illustration of a generic sensor according to the disclosed embodiments.

In the disclosed embodiments, we resolve these problems by implementing a device comprising a partially wound magnetic core, the windings of this coil being fed by an oscillator. FIG. 2 illustrates a generic embodiment of the disclosed embodiments.

FIG. 2 shows a magnetic core 201 characterized by its geometric dimensions, its effective length Le, and its affective area Ae. The core is also characterized by its magnetic properties described by its hysteresis cycle B=fct(H). B is the flux density in the magnetic material, and H is the magnetic field.

FIG. 2 also shows a primary conductor 202 in which an Iprim current flows. The conductor carries out Nprim turns around the core. In the example in FIG. 2, Nprim is equal to 1.

A secondary conductor 203, called an exciter coil, is connected both to a square signal generator 204 and to a resistor 205 (Rsense value) for measuring the Isec current. This coil has a number Nsec of turns (usually around a thousand).

The square signal voltage generator 204 delivers a square-wave voltage Vosc that switches between the voltages +E and −E. The generator's role is alternatively to bring the magnetic material with +Bsat to −Bsat saturation (or even the excursion of magnetic flux density DB) to a frequency Fosc.

Under these conditions, the observed current Isec will continue to follow changes in the voltage Vosc, with a delay and along a known curve.

If there is no current flowing through the primary conductor, the current is perfectly centered on the zero current.

However, if there is a current flowing through the primary conductor, an imbalance is created in the hysteresis cycle, and saturation occurs sooner, on the side of the imbalance. This imbalance will show in the secondary current, by the appearance of an average current.

The average current is the reflection of the primary current. Its value is the result of a transformation equation:

$$Isec=(Nprim/Nsec)Iprim$$

In the disclosed embodiments, the average current Isec is extracted, making it possible to deduce the value of the current to be measured Iprim. The extraction is performed by integrating the current Isec.

The disclosed embodiments thus relate to a current sensor device, characterized in that it comprises:
  a magnetic core,
  a primary coil in which the current to be measured flows and winds around the magnetic core,
  a secondary coil that winds around the magnetic core,
  an electronic oscillator connected between an electrical ground and a first terminal of the secondary coil,
  a measurement resistor connected between the electrical ground and a second terminal of the secondary coil via an extractor circuit.

In one variant of the disclosed embodiments, the device according to the disclosed embodiments is also characterized in that the magnetic core is about one micrometer thin.

In one variant, the device according to the disclosed embodiments is also characterized in that the number of turns in the primary coil is equal to 1, which means that it is a simple wire traversing the magnetic core.

Figure 6:
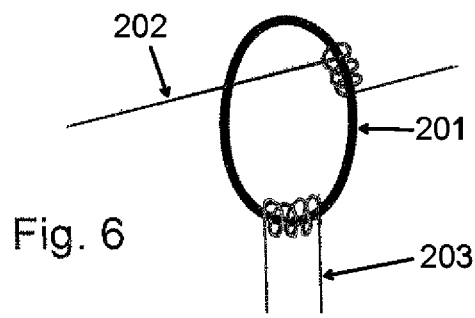
FIG. 6: A schematic illustration of a generic sensor according to the disclosed embodiments.

In one variant, the device 201 according to the disclosed embodiment is also characterized in that the number of turns in the primary coil 202 is strictly greater than 1 (FIG. 6).

In one variant, the device according to the disclosed embodiments is also characterized in that the number of turns in the secondary coil is around a thousand.

In one variant, the device according to the disclosed embodiments is also characterized in that the extractor circuit is an integrator circuit whose inputs are the electrical ground and the terminal of the secondary coil, to which the measuring resistor is connected, the output of the integrator circuit being connected to the measuring resistor's terminal, which is not connected to the secondary coil.

Figure 3:
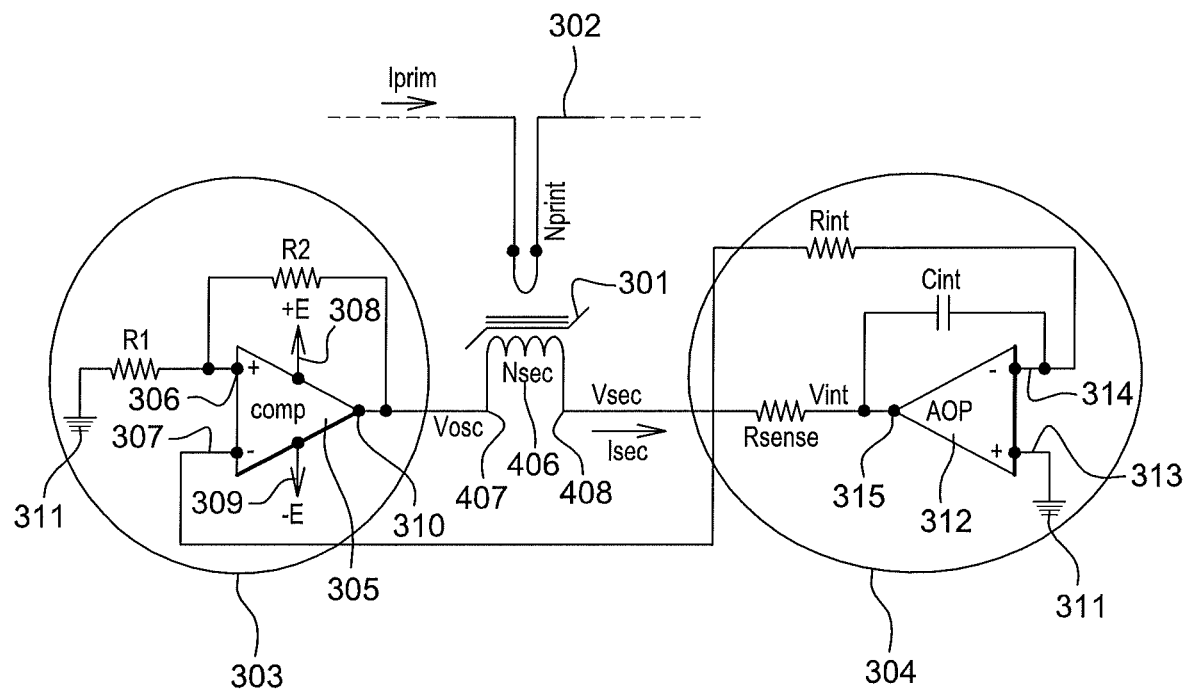
FIG. 3: An illustration of a practical implementation of a sensor according to the disclosed embodiments.

FIG. 3 shows a primary conductor 302, such as any sized wire or an electronic circuit track. The conductor passes through a magnetic core 301, thus forming a loop with Nprim=1 turn around the core 301. This conductor is a primary coil traversed by a current Iprim, which must be measured.

Figure 4:
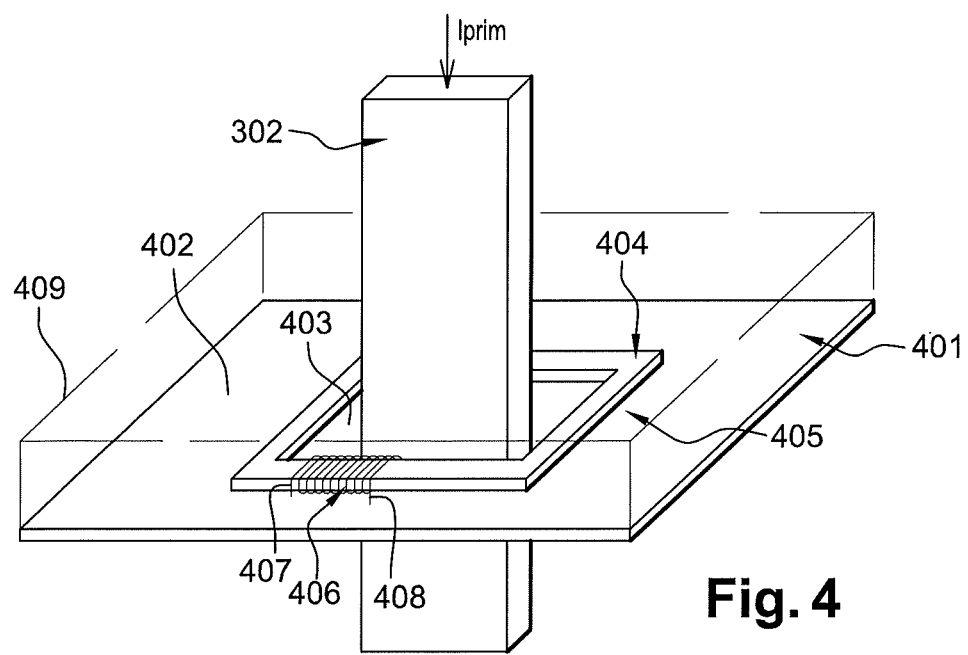
FIG. 4: An illustration of a physical realization of a magnetic core according to the disclosed embodiments.

In one implementation of the disclosed embodiments, the core 301 is micrometer section of a few dozen micrometers. FIG. 4 illustrates such a core.

On the various figures, matching numbers reference identical elements.

FIG. 4 shows a conductor 302 that traverses a square section mechanical core 401 by means of a central opening. In practice, this section may be another shape, for example circular or rectangular. The core 401 is hollowed out in the middle by an opening 403.

The core 401 is comprised of several elements. The core 401 includes a support 402 that is formed in a non-magnetic and electrically non-conductive substrate. The support 402 therefore has a crowned section.

The core 401 also has, on at least one of its faces, near the opening 403, a closed magnetic loop 404 with micrometric dimensions, a few dozen micrometers in practice. This loop 404 is made from an electromagnetic material placed on the support 402 using a micrometric screen printing method, the most common of these methods being:
  electrochemistry,
  spraying,
  spraying and a heat treatment, if ferrites are used.

The core 401 also has, on the loop 404, an insulating layer 405 that is a few to a few dozen microns thick. This insulating layer is made using a micrometric screen printing process, the most common for this operation being:
  photolithography for polymer insulators, or
  the deposit of metal oxides, such as $SiO_2$ or $AL_2O_3$.

The core 401 finally includes, wound around the core 404, a coil 406 with turns, corresponding to the secondary coil in the disclosed embodiments, itself also made using a micrometric screen printing method like those used to make the core 404. The coil 406 has two ends 407 and 408, to which the other elements of the sensor according to the disclosed embodiments are connected.

The set of core 402, 404, 405, and 406 is covered by a protective molding 409 such that said molding insulates said core by leaving the opening 403 open and by leaving the ends 407 and 408 accessible so that the other elements of the disclosed embodiments can connect to it.

This assembly allows for good insulation between the circuit, whose size and measuring circuit must be measured itself. Hence we have an insulated current sensor.

FIG. 3 shows a secondary coil 406 comprising Nsec=1000 turns.

FIG. 3 shows that the end 407 is connected to an oscillator circuit 303 and that the end 408 is connected to an integrator circuit 304.

FIG. 3 shows that the oscillator circuit 303 has an operational amplifier 305. This operational amplifier 305 comprises:
  a non-inverting input 306,
  an inverting input 307,
  a positive feed input 308,
  a negative feed input 309, and
  an output 310 delivering an output voltage Vosc.

The input 306 is connected to an electrical ground 311 via a resistor R1.

The input 306 is connected to the output 310 via a resistor R2.

The input 307 is directly connected to the end 408.

The input 308 is connected to a potential +E.

The input 309 is connected to a potential −E.

The output 310 is connected to the end 407.

FIG. 3 shows that the integrator circuit 304 has an operational amplifier 312. This operational amplifier 312 comprises:
- a non-inverting input 313,
- an inverting input 314,
- an output 315 delivering an output voltage Vint.

The input 311 is connected to the electrical ground 311.

The input 314 is connected to the output 408 via a resistor Rint.

The input 314 is connected to the output 315 via a condensator Cint.

The output 315 is connected to the end 408 via a resistor Rsense, which is the measuring resistor.

For these circuits 303 and 304, the values of the components vary greatly, depending on the application. A sensor with a R1, R2, and Rint of around 10 Kohms, an Rsense of around 100 ohms, and a Cint of around 10 nF can easily be made.

In operation, the circuit 303 is an oscillator with an independent voltage. It is a comparator whose inverting 307 and non-inverting 306 inputs oscillate between E and −E.

The system's positive response is ensured by looping the output back to the non-inverting input by a gain G<1. For this assembly, the gain G is R1/(R1+R2).

Hence, the voltage oscillator is a comparator whose output voltage can vary between +E and −E. This voltage makes a current Isec flow through the coil 406. This current causes the magnetic core to be saturated. The voltage Vsec increases until it reaches the voltage $$E(R1/R1+R2) \text{ or } E(R1R1+R2)$$

as appropriate. At this time, the comparator switches, and saturation goes in the opposite direction, as illustrated by FIG. 5, which shows that Vosc is a square voltage with frequency Fosc.

The oscillation frequency (Fosc) is determined by the speed in which the magnetic core is saturated. This frequency is given by Faraday's law:

$$Fosc=2E/(NsecAe\Delta B)$$

Figure 5:
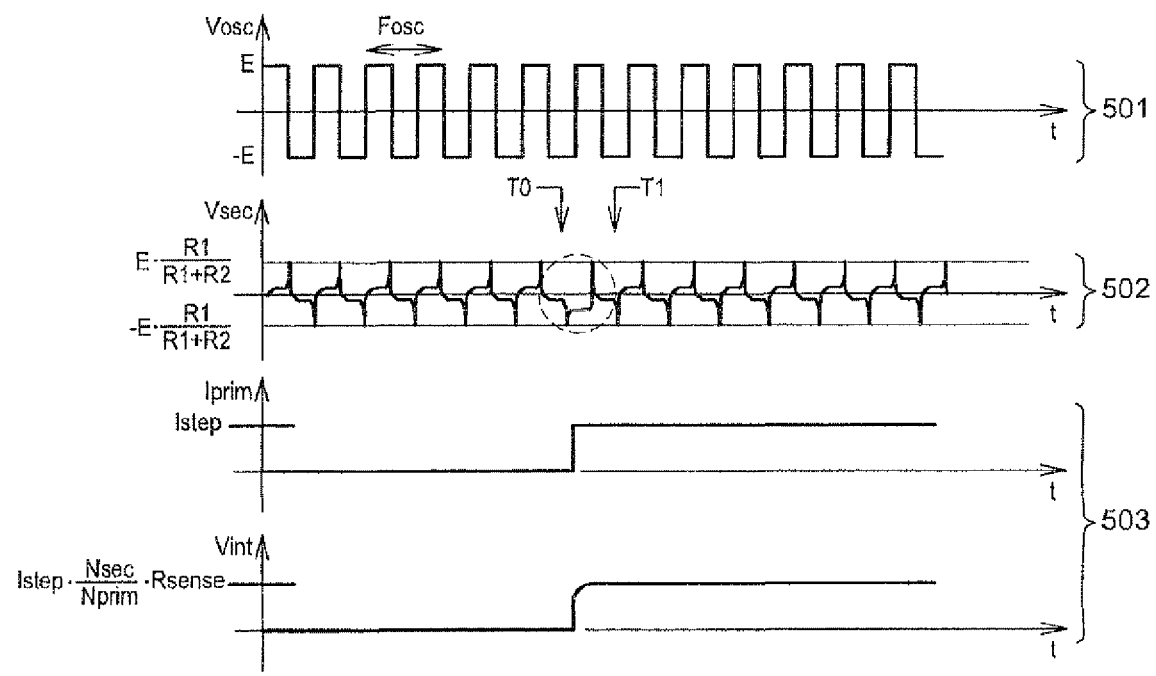
FIG. 5: A correlated illustration of changes in Vosc, Vsec, Iprim, and Vint signals over time.

FIG. 5 also illustrates the voltage Vsec based on changes in Vosc. The voltage Vsec follows the voltage Vosc, with a deformation due to the magnetic core. The voltage Vosc has a zero average value, except when there is a current change in the conductor 302. In this case, the voltage Vsec is disrupted and then restored in its stable form due to the action of the integrator circuit 304.

In operation, the circuit 304 is a looped system consisting of a comparator and an "integrator" function with gain Ki, allowing the image of the average value of the current Iprim, or the potential Vint, to be extracted. This voltage is fed back into Rsense, which slaves the oscillation at the middle of the hysteresis cycle by offsetting the imbalance created by the primary current's ampere-turns. For this assembly, the gain Ki is equal to 1/(Rint*Cint).

When a current flows (T0) through the conductor Nprim, there is a difference in the average voltage of Vsec. This voltage is compared to a setpoint value of 0 volts. The result of this comparison is offset by the integrator. The output Vint is fed back into Rsense to cancel the average component.

Diagrams 502 and 503 in FIG. 5 show the effect of current-stepping (step on Vsec). The average value changes until the compensation loop reacts and resets (T1) the average value of Vsec to 0 volts by injecting a voltage Vint. The value of Vint is then fundamentally a direct image of the current to be measured Iprim $$Vint=Rsense(Nprim/Nsec)Iprim$$

The measurement of Vint therefore allows us to find out Iprim and thus obtain the value for controlling a device.

Due to its physical construction, there is a separation between the primary conductor 302 and the measurement circuit according to the disclosed embodiments. An electrical isolation of several thousand volts can thus be easily obtained.

The sensor according to the disclosed embodiments can achieve greater accuracy than other measurement methods. The accuracy of the measurement is essentially tied to the accuracy of the resistor Rsense. This is a low-power resistor, which can easily be found in accuracies of around 0.1%, with low sensitivity to temperature conditions.

The principle of offsetting ampere-turns with an integrator makes it possible to extract and measure with zero error. The ampere-turns themselves, not an image of them, are offset through an intermediary sensor that triggers an error.

The sensor's dynamics is related to the speed of the hysteresis cycle. Faraday's law requires a core that is a few dozen micrometers thick. This is made possible due to a magnetic screen printing circuit. A bandwidth >100 Khz can thus be obtained.

There are no magnetic offset issues because, by principle, the core is constantly saturated. It is magnetized and demagnetized with each oscillation.

The transforming effect guarantees good linearity.

The integrator ensures that there is no offset in the vicinity of the zero current.

The sensor according to the disclosed embodiments therefore has all of the desired advantages.

It is therefore possible to use the sensor according to the disclosed embodiments in hard industrial settings, such as aerospace. Possible onsite uses include:
- Electric actuators and actuators implementing synchronous self-controlled machines with permanent magnets ("brushless" engines) (EMA, EABS electrical brakes, etc).
- Electrical "pump" devices implementing "brushless" self-controlled magnets associated with power electronics (FUEL PUMP device, EHA pump).
- A protective device for power switches (GFI breakers, SEPDS, SSPC, etc.).
- Power converters for power systems on future aircraft. Examples include DC/DC converters for continuous high-voltage networks, or sinusoidal current absorption (PFC).
- Switch mode power supply (SMPS).

The invention claimed is:

1. A current sensor device, comprising:
a magnetic core,
a primary coil in which the current to be measured flows and traverses the magnetic core,
a secondary coil that winds around the magnetic core,
an electronic oscillator comprising an operational amplifier having a non-inverting input connected directly to ground and an output connected directly to a first terminal of the secondary coil, the operational amplifier having an inverting input connected directly to an extractor circuit; and
a measurement resistor (Rsense) connected between the electrical ground and a second terminal of the secondary coil via the extractor circuit, wherein the extractor circuit is an integrator circuit whose inputs are the electrical ground and the second terminal of the secondary coil, to which the measurement resistor is connected, the output of the extractor circuit being connected to the measurement resistor's terminal, which is not connected to the secondary coil.

2. A device according to claim 1, wherein the magnetic core is about one micrometer thin.

3. A device according to claim 1, wherein the number of turns in the primary coil is equal to 1, which means that it is a simple wire traversing the magnetic core.

4. A device according to claim 1, wherein the number of turns in the primary coil is strictly greater than 1.

5. A device according to claim 1, wherein the number of turns in the secondary coil is around a thousand.

6. A current sensor device, comprising:
a magnetic core,
a primary coil in which the current to be measured flows and traverses the magnetic core,
a secondary coil that winds around the magnetic core,
an electronic oscillator connected between an electrical ground and a first terminal of the secondary coil, and connected to an extractor circuit,
wherein the extractor circuit comprises a condensator (Cint) and an operational amplifier having a non-inverting input and an inverting input, and
wherein one side of the condensator is connected directly to the inverting input of the operational amplifier and an opposite side of the condensator is connected directly to a measurement resistor (Rsense), and the inverting input of the operational amplifier is connected to an inverting input of the electronic oscillator.

7. A device according to claim 6, wherein the magnetic core is about one micrometer thin.

8. A device according to claim 6, wherein the number of turns in the primary coil is equal to 1, which means that it is a simple wire traversing the magnetic core.

9. A device according to claim 6, wherein the number of turns in the primary coil is strictly greater than 1.

10. A device according to claim 6, wherein the number of turns in the secondary coil is around a thousand.

11. A device according to claim 6, wherein the extractor circuit is an integrator circuit whose inputs are the electrical ground and the second terminal of the secondary coil, to which the measurement resistor is connected, the output of the extractor circuit being connected to the measurement resistor's terminal, which is not connected to the secondary coil.

12. A current sensor device, comprising:
a magnetic core,
a primary coil in which the current to be measured flows and traverses the magnetic core,
a secondary coil that winds around the magnetic core,
an electronic oscillator comprising an operational amplifier with a non-inverting input connected directly to an electrical ground and an output connected directly to a first terminal of the secondary coil, the operational amplifier having an inverting input connected directly to an extractor circuit,
wherein the extractor circuit comprises a condensator (Cint) and a second operational amplifier having a non-inverting input and an inverting input, and
wherein the condensator is connected directly to the inverting input of the second operational amplifier and directly to a measurement resistor (Rsense), and the inverting input of the second operational amplifier is directly connected to an inverting input of the operational amplifier of the electronic oscillator, and
the measurement resistor is connected though the second operational amplifier to the electrical ground and directly to a second terminal of the secondary coil.

13. A device according to claim 12, wherein the magnetic core is about one micrometer thin.

14. A device according to claim 12, wherein the number of turns in the primary coil is equal to 1, which means that it is a simple wire traversing the magnetic core.

15. A device according to claim 12, wherein the number of turns in the primary coil is strictly greater than 1.

16. A device according to claim 12, wherein the number of turns in the secondary coil is around a thousand.

17. A device according to claim 12, wherein the extractor circuit is an integrator circuit whose inputs are the electrical ground and the second terminal of the secondary coil, to which the measurement resistor is connected, the output of the extractor circuit being directly connected to the measurement resistor.

18. A device according to claim 12, wherein the extractor circuit is an integrator circuit whose inputs are the electrical ground and the second terminal of the secondary coil via a resistor (Rint) the output of the extractor circuit being directly connected to the measurement resistor.

* * * * *